United States Patent
Furuichi

(10) Patent No.: US 8,444,194 B2
(45) Date of Patent: May 21, 2013

(54) SUBSTRATE TRANSPORT HAND AND SUBSTRATE TRANSPORT ROBOT

(75) Inventor: Masatoshi Furuichi, Kitakyushu (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 221 days.

(21) Appl. No.: 13/019,935

(22) Filed: Feb. 2, 2011

(65) Prior Publication Data
US 2011/0243690 A1 Oct. 6, 2011

(30) Foreign Application Priority Data

Mar. 31, 2010 (JP) ................................. 2010-081637
Nov. 17, 2010 (JP) ................................. 2010-257005

(51) Int. Cl.
*H01L 21/677* (2006.01)
*B25J 15/00* (2006.01)

(52) U.S. Cl.
USPC ........................ 294/213; 414/222.01; 414/941

(58) Field of Classification Search
USPC ............. 294/213, 183, 902; 414/217, 222.01, 414/751.1, 941
See application file for complete search history.

(56) References Cited

U.S. PATENT DOCUMENTS

| 5,445,486 A * | 8/1995 | Kitayama et al. ............. 294/213 |
| 5,669,644 A * | 9/1997 | Kaihotsu et al. ............... 294/213 |
| 5,746,460 A * | 5/1998 | Marohl et al. ................. 294/213 |
| 6,216,883 B1 * | 4/2001 | Kobayashi et al. ........... 414/941 |
| 6,276,731 B1 * | 8/2001 | Hino ............................. 294/213 |
| 6,305,898 B1 * | 10/2001 | Yamagishi et al. ....... 414/222.01 |
| RE37,731 E * | 6/2002 | Ogawa et al. ................. 414/941 |
| 6,737,826 B2 * | 5/2004 | Gilchrist .................... 414/751.1 |
| 7,641,247 B2 * | 1/2010 | Blonigan et al. .............. 294/213 |
| 7,748,760 B2 * | 7/2010 | Kushida et al. ............... 294/907 |
| 7,878,562 B2 * | 2/2011 | Hamano et al. ............... 294/213 |
| 8,141,926 B2 * | 3/2012 | Fujii et al. ..................... 414/941 |
| 8,382,180 B2 * | 2/2013 | Kanawade et al. ........... 294/902 |

FOREIGN PATENT DOCUMENTS

| JP | 63-059329 U | 4/1988 |
| JP | 2001-274232 | 10/2001 |

* cited by examiner

*Primary Examiner* — Paul T Chin
(74) *Attorney, Agent, or Firm* — Ditthavong Mori & Steiner, P.C.

(57) ABSTRACT

This substrate transport hand includes a first receiving portion and a second receiving portion capable of receiving a first substrate and a second substrate thereon respectively, a third receiving portion supporting the first substrate received on the first receiving portion along with the first receiving portion, and a fourth receiving portion movably provided on a hand body portion for supporting the second substrate received on the second receiving portion along with the second receiving portion when moved to a first position of the hand body portion.

20 Claims, 6 Drawing Sheets

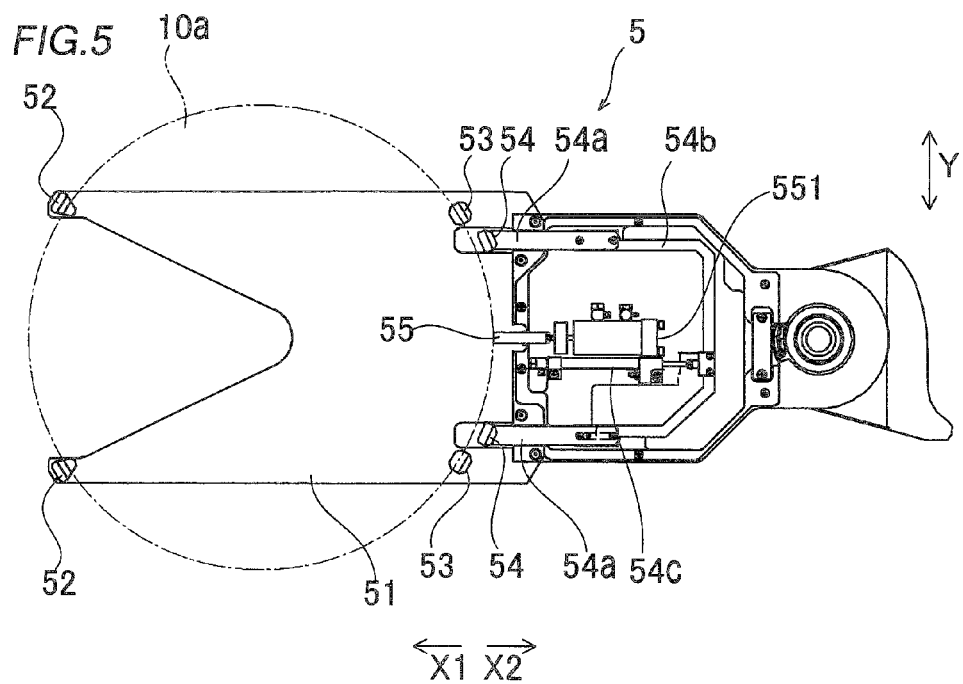
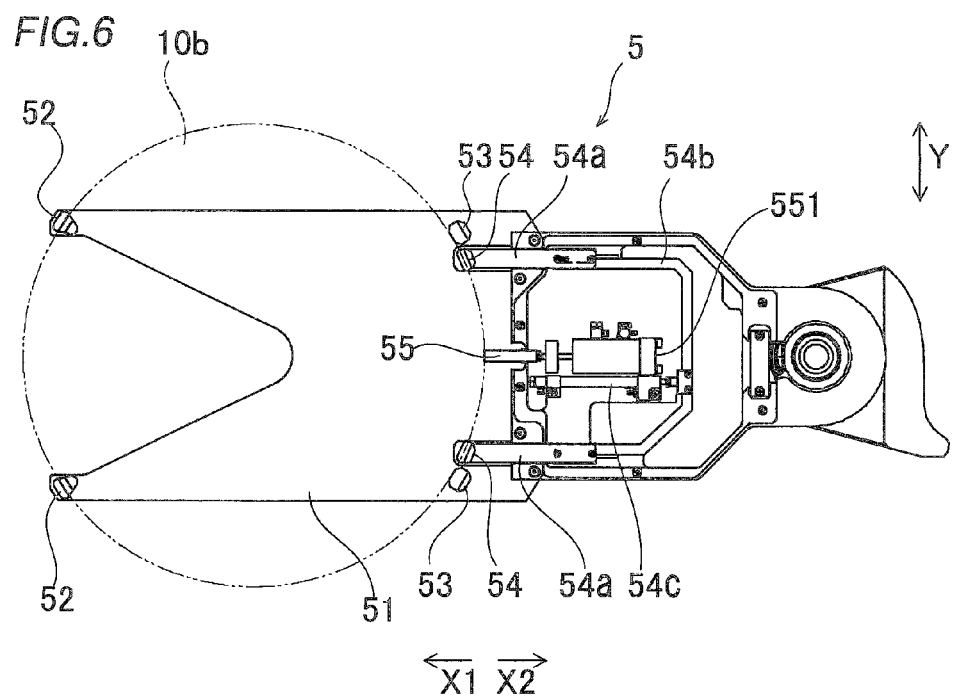

US 8,444,194 B2

SUBSTRATE TRANSPORT HAND AND SUBSTRATE TRANSPORT ROBOT

CROSS-REFERENCE TO RELATED APPLICATIONS

The priority application number JP2010-081637, Substrate Distinguishing Hand, Mar. 31, 2010, Masatoshi Furuichi, and the priority application number JP2010-257005, Substrate Transport Hand and Substrate Transport Robot, Nov. 17, 2010, Masatoshi Furuichi, upon which this patent application is based are hereby incorporated by reference.

BACKGROUND OF THE INVENTION

1. Field of the Invention

The present invention relates to a substrate transport hand and a substrate transport robot.

2. Description of the Background Art

A substrate transport hand including receiving portions capable of receiving substrates thereon is known in general. Japanese Patent Laying-Open No. 2001-274232 discloses a substrate transport hand including a pair of arm portions (hand body portions) and a plurality of wafer support members provided on each of the pair of arm portions. This substrate transport hand is so formed that the pair of arm portions are movable in directions approaching to and separating from each other. Each wafer support member is formed stepwise, to be capable of receiving substrates on first and second grasp portions (receiving portions) provided on the upper and lower steps thereof respectively. In order to receive the corresponding substrate on the first grasp portion provided on the upper step, the substrate transport hand adjusts the position of the wafer support member so that an end of the substrate comes into contact with the first grasp portion by moving the pair of arm portions thereby controlling the interval between the arm portions. In order to receive the corresponding substrate on the second grasp portion provided on the lower step, further, the substrate transport hand adjusts the position of the wafer support member so that an end of the substrate comes into contact with the second grasp portion by moving the pair of arm portions thereby controlling the interval between the arm portions. Thus, the substrate transport hand can support the substrates on different positions with the two different grasp portions (receiving portions).

SUMMARY OF THE INVENTION

A substrate transport hand according to a first aspect of the present invention includes a hand body portion, a first receiving portion and a second receiving portion capable of receiving a first substrate and a second substrate thereon respectively, a third receiving portion supporting the first substrate received on the first receiving portion along with the first receiving portion, and a fourth receiving portion movably provided on the hand body portion for supporting the second substrate received on the second receiving portion along with the second receiving portion when moved to a first position of the hand body portion.

A substrate transport robot according to a second aspect of the present invention includes a substrate transport hand and a control portion controlling the substrate transport hand, while the substrate transport hand includes a hand body portion, a first receiving portion and a second receiving portion capable of receiving a first substrate and a second substrate thereon respectively, a third receiving portion supporting the first substrate received on the first receiving portion along with the first receiving portion, and a fourth receiving portion movably provided on the hand body portion for supporting the second substrate received on the second receiving portion along with the second receiving portion when moved to a first position of the hand body portion.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a plan view showing a state of receiving a substrate with a lower receiving portion of each substrate transport hand according to the first embodiment of the present invention;

FIG. 6 is a plan view showing a state of supporting another substrate with an upper receiving portion of each substrate transport hand according to the first embodiment of the present invention;

DESCRIPTION OF THE PREFERRED EMBODIMENTS

Embodiments of the present invention are now described with reference to the drawings.

(First Embodiment)

First, the structure of a substrate transport robot 100 including substrate transport hands 5 according to a first embodiment of the present invention is described with reference to FIGS. 1 to 9.

Figure 1:
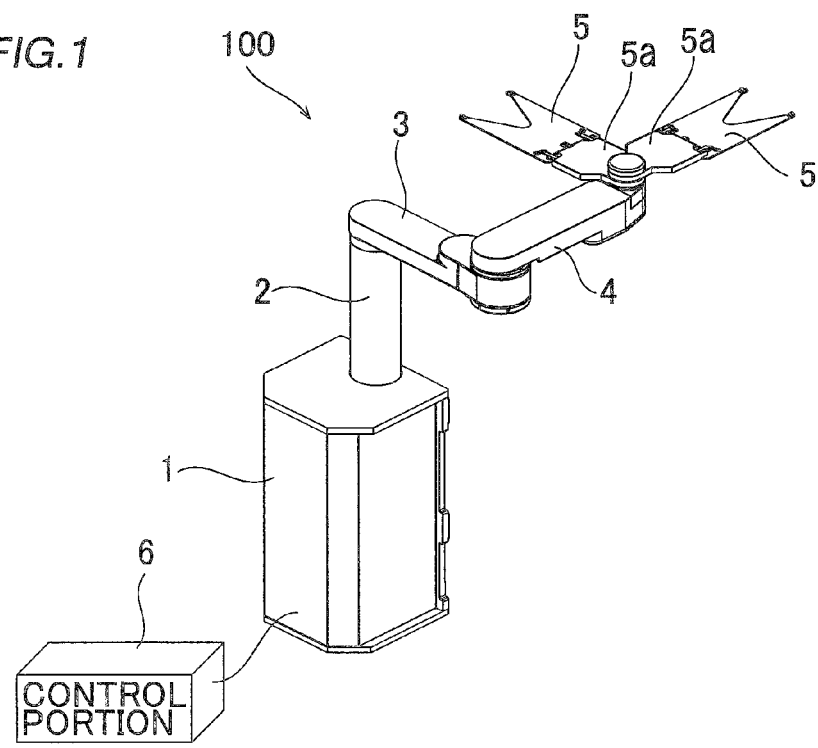
FIG. 1 is a perspective view showing the overall structure of a substrate transport robot including substrate transport hands according to a first embodiment of the present invention.
Figure 2:
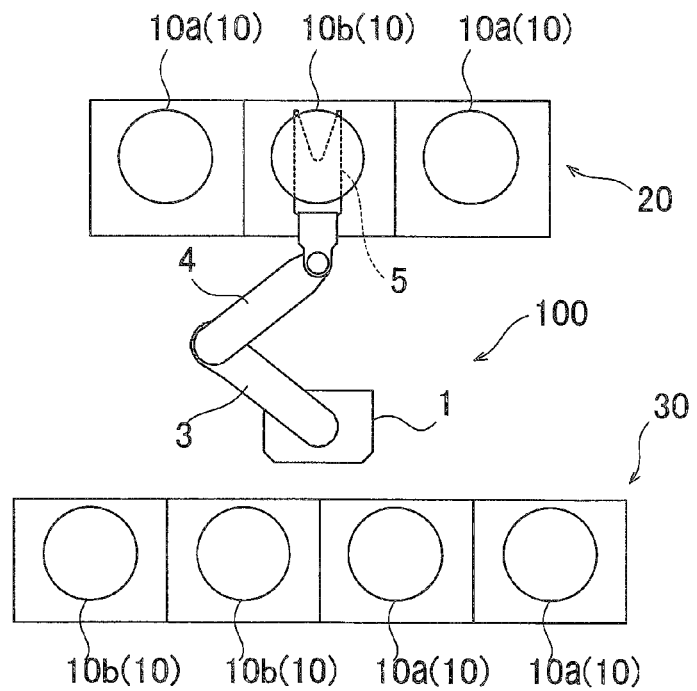
FIG. 2 is a plan view showing the overall structure of an apparatus employing the substrate transport robot including the substrate transport hands according to the first embodiment of the present invention.

The substrate transport robot 100 is an articulated robot, as shown in FIG. 1. More specifically, the substrate transport robot 100 includes a base member 1, a support shaft 2, a first arm portion 3, a second arm portion 4, two substrate transport hands 5 according to the first embodiment of the present invention and a control portion 6 controlling the respective portions of the substrate transport robot 100. The substrate transport robot 100 is formed to be capable of transporting substrates 10 between a treating apparatus 20 employed in a manufacturing process for semiconductor devices and a substrate storage cassette 30 corresponding to FOUPs (front open unified pods) according to SEMI (Semiconductor Equipment and Materials International) standards. In more detail, the substrate transport robot 100 is formed to transport treated substrates 10a treated by the treating apparatus 20 from the treating apparatus 20 to the substrate storage cassette 30 and to transport untreated substrates 10b not yet treated by the treating apparatus 20 from the substrate storage cassette 30 to the treating apparatus 20. The second arm portion 4 is an example of the "arm portion" in the present invention. The treated substrates 10a and the untreated substrates 10b are examples of the "first substrate" and the "second substrate" in the present invention respectively.

The support shaft 2 is supported by the base member 1. The support shaft 2 is formed to vertically extend with respect to the upper surface of the base member 1. A first end of the first arm portion 3 is connected to the upper end of the support shaft 2. The first arm portion 3 is formed to be rotatable on the support shaft 2, serving as a rotating shaft, in a horizontal plane. A first end of the second arm portion 4 is connected to a second end of the first arm portion 3. The second arm portion 4 is formed to be rotatable on the first end, serving as the center of rotation, connected to the first arm portion 3 in a horizontal plane. The two substrate transport hands 5 are connected to a second end of the second arm portion 4. The two substrate transport hands 5 are formed to be rotatable on portions, serving as the centers of rotation, connected to the second arm portion 4 in horizontal planes independently of each other. Base sides of the two substrate transport hands 5 are covered with covers 5a.

Figure 3:
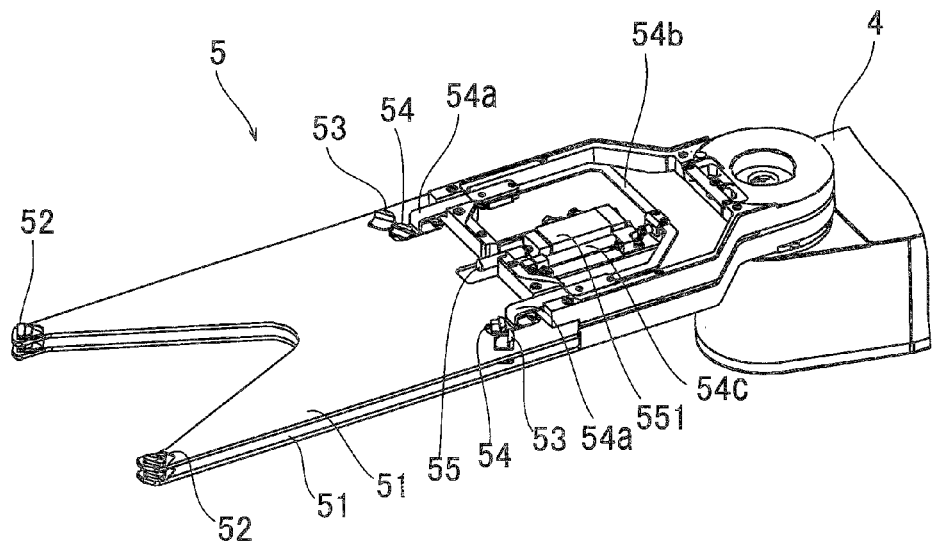
FIG. 3 is a perspective view showing the substrate transport hands according to the first embodiment of the present invention.
Figure 4:
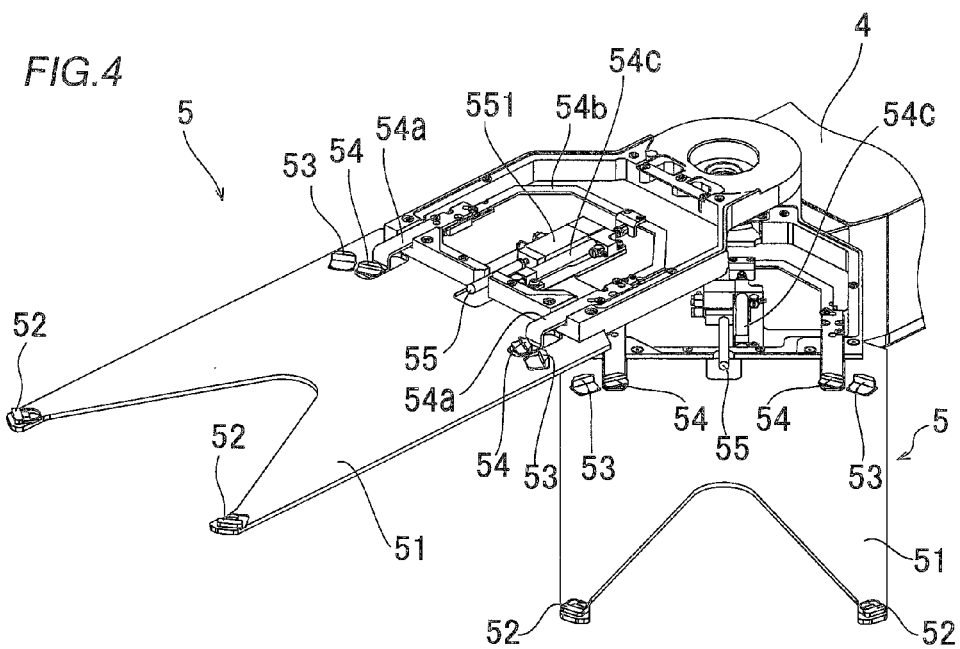
FIG. 4 is a perspective view showing a case of arranging two substrate transport hands according to the first embodiment of the present invention in a planarly spread state.

The two substrate transport hands 5 are similar in structure to each other, and arranged to vertically overlap with each other, as shown in FIGS. 3 and 4. The two substrate transport hands 5 correspond to the FOUPs of the SEMI standards. Each substrate transport hand 5 is formed to be capable of introducing/discharging two stacked substrates 10 into/from the substrate storage cassette 30. The substrate transport hand 5 is mainly constituted of a hand body portion 51, a pair of front support portions 52, a pair of rear fixed support portions 53 and a pair of rear movable support portions 54, as shown in FIGS. 3 and 4.

The hand body portion 51 is in the form of a flat plate, and substantially horizontally arranged. The forward end of the hand body portion 51 is substantially V-shaped (forked).

The pair of front support portions 52 are provided for supporting the substrates 10 on the forward end side (along arrow X1 in FIGS. 5 and 6) of the hand body portion 51. Further, the pair of front support portions 52 are fixedly provided on the upper surface of the hand body portion 51, and arranged on the substantially V-shaped forward end of the hand body portion 51. In addition, the pair of front support portions 52 are similar in structure to each other.

Figure 7:
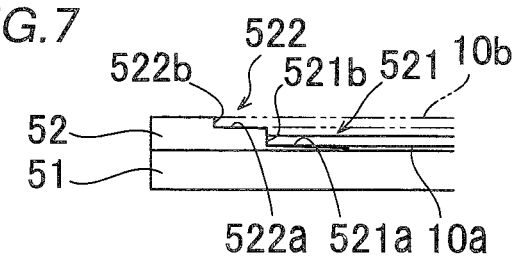
FIG. 7 is a side elevational view showing the lower and upper receiving portions of each substrate transport hand according to the first embodiment of the present invention.

According to the first embodiment, each front support portion 52 is formed stepwise, as shown in FIG. 7. More specifically, the front support portion 52 has a lower receiving portion 521 and an upper receiving portion 522 arranged on different vertical positions located on lower and upper steps respectively. The lower and upper receiving portions 521 and 522 are arranged on positions deviating from each other in plan view (as viewed from above). Further, the lower and upper receiving portions 521 and 522 are formed to be capable of receiving the substrates 10 (10a and 10b) on the different vertical positions deviating from each other in plan view. More in detail, the lower and upper receiving portions 521 and 522 receive the treated and untreated substrates 10a and 10b respectively. Further, the lower and upper receiving portions 521 and 522 are provided with receiving surfaces 521a and 522a and wall portions 521b and 522b respectively. The receiving surface 521a (522a) is circularly bent and inclined to gradually lower toward the center of the substrate 10 received thereon, so that the substantially horizontally supported substrate 10 and the receiving surface 521a (522a) are in line contact with each other. The wall portion 521b (522b) is formed in a substantially vertical plane. The lower and upper receiving portions 521 and 522 are examples of the "first receiving portion" and the "second receiving portion" in the present invention respectively. The wall portions 521b and 522b are examples of the "first wall portion" and the "second wall portion" in the present invention respectively.

The pair of rear fixed support portions 53 are fixedly provided on the upper surface of the hand body portion 51, as shown in FIGS. 3 to 6. Further, the pair of rear fixed portions 53 are arranged on the base side (along arrow X2 in FIGS. 5 and 6) of the hand body portion 51. In addition, the pair of rear fixed portions 53 are arranged in the vicinity of both ends of the hand body portion 51 in the width direction (along arrow Y in FIGS. 5 and 6) respectively. The pair of rear fixed support portions 53 are similar in structure to each other.

Figure 8:
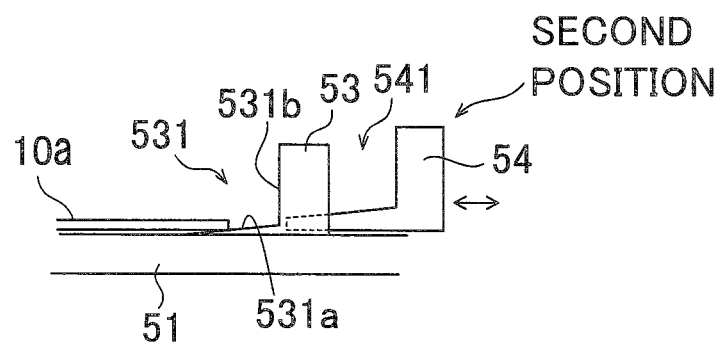
FIG. 8 is a side elevational view showing a state where a receiving portion of a rear movable support portion of each substrate transport hand according to the first embodiment of the present invention is located on a second position.

As shown in FIG. 8, each rear fixed support portion 53 has a receiving portion 531 capable of receiving the corresponding substrate 10 thereon. The receiving portion 531 is formed to support the treated substrate 10a received on the lower receiving portion 521 of the front support portion 52 along with the lower receiving portion 521. Further, the receiving portion 531 is arranged on a vertical position corresponding to that of the lower receiving portion 521 of the front support portion 52. More specifically, the receiving portion 531 is formed to support the treated substrate 10a received on the lower receiving portion 521 of the front support portion 52 in a substantially horizontal state. Further, the receiving portion 531 is formed to support the treated substrate 10a on a vertical position different from that of the untreated substrate 10b received on the upper receiving portion 522 of the front support portion 52 and deviating therefrom in plan view. In addition, the receiving portion 531 is formed to support the treated substrate 10a when the pair of rear movable support portions 54 are moved to a second position on the hand body portion 51 so that the same do not come into contact with the treated substrate 10a, as described later. The receiving portion 531 is an example of the "third receiving portion" in the present invention.

The receiving portion 531 is provided with a receiving surface 531a and a wall portion 531b. The receiving surface 531a is circularly bent and inclined to gradually lower toward the center of the treated substrate 10a received thereon, so that the substantially horizontally supported treated substrate 10a and the receiving surface 531a are in line contact with each other. The wall portion 531b is formed in a substantially vertical plane.

The pair of rear movable support portions 54 are movably provided on the upper surface of the hand body portion 51, as shown in FIGS. 3 to 6. Further, the pair of rear movable support portions 54 are provided independently of the pair of rear fixed support portions 53, and arranged on the base side (along arrow X2 in FIGS. 5 and 6) of the hand body portion 51. In addition, the pair of rear movable support portions 54 are arranged in the vicinity of both ends of the hand body portion 51 in the width direction (along arrow Y in FIGS. 5 and 6) respectively. The pair of rear movable support portions 54 are arranged in proximity to the inner sides of the pair of rear fixed support portions 53 in the width direction of the hand body portion 51. The pair of rear movable support portions 54 are similar in structure to each other.

A structure for moving the pair of rear movable support portions 54 with respect to the hand body portion 51 is now described. A pair of mounting portions 54a are mounted on the pair of rear movable support portions 54 to extend from the rear movable support portions 54 toward the base side (along arrow X2 in FIGS. 5 and 6) of the hand body portion 51, as shown in FIGS. 3 to 6. The pair of mounting portions 54a are arranged in parallel with each other. A coupling portion 54b is mounted on ends (closer to the base side of the hand body portion 51) of the pair of mounting portions 54a opposite to the side mounted on the rear movable support portions 54, to couple the mounting portions 54a with each other. The coupling portion 54b is substantially U-shaped. In other words, the coupling portion 54b couples receiving portions 541, described later, provided on the pair of rear movable support portions 54 respectively through the mounting portions 54a. Further, the coupling portion 54b is formed to be movable in the anteroposterior direction (along arrows X1 and X2 in FIGS. 5 and 6) by an air cylinder 54c. Thus, the pair of mounting portions 54a are linearly movable in the extensional direction thereof (in the anteroposterior direction). The pair of mounting portions 54a so linearly move in the anteroposterior direction as to move the pair of rear movable support portions 54 to the second position and a first position on the hand body portion 51. The air cylinder 54c is arranged on a position (inner position) surrounded by the substantially U-shaped coupling portion 54b.

Figure 9:
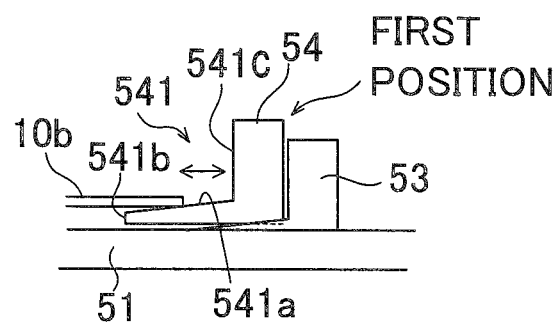
FIG. 9 is a side elevational view showing a state where the receiving portion of the rear movable support portion of each substrate transport hand according to the first embodiment of the present invention is located on a first position.

As shown in FIG. 9, each rear movable support portion 54 has the receiving portion 541 capable of receiving the corresponding substrate 10 thereon. The receiving portion 541 is formed to support the untreated substrate 10b received on the upper receiving portion 522 of the front support portion 52 along with the upper receiving portion 522. Further, the receiving portion 541 is arranged on a vertical position corresponding to that of the upper receiving portion 522 of the front support portion 52. More specifically, the receiving portion 541 is formed to support the untreated substrate 10b received on the upper receiving portion 522 of the front support portion 52 in a substantially horizontal state. Further, the receiving portion 541 is formed to support the untreated substrate 10b on a vertical position different from that of the treated substrate 10a received on the lower receiving portion 521 of the front support portion 52 and deviating therefrom in plan view. In addition, the receiving portion 541 of the rear movable support portion 54 is formed to support the untreated substrate 10b when moved to the first position on the hand body portion 51. The first position on the hand body portion 51 is closer to the upper receiving portion 522 of the front support portion 52 than the second position (see FIG. 8) on the hand body portion 51 where the rear movable support portion 54 does not come into contact with the treated substrate 10a. The receiving portion 541 is an example of the "fourth receiving portion" in the present invention.

The receiving portion 541 is provided with a receiving surface 541a, a front wall portion 541b and a rear wall portion 541c. The receiving portion 541a is circularly bent and inclined to gradually lower toward the center of the untreated substrate 10b received thereon, so that the substantially horizontally supported untreated substrate 10b and the receiving surface 541a are in line contact with each other. The front wall portion 541b is continuously formed to extend downward from the front end (closer to the forward end) of the receiving surface 541a. The rear wall portion 541c is continuously formed to extend upward from the rear end (closer to the base side) of the receiving surface 541a. The front and rear wall portions 541b and 541c are formed in substantially vertical planes.

A pressing portion 55 pressing the substrates 10 (10a and 10b) supported by the support portions 52 to 54 toward the forward end side (along arrow X1 in FIGS. 5 and 6) is provided on the hand body portion 51. The pressing portion 55 is arranged between the pair of rear movable support portions 54. Further, the pressing portion 55 is formed to be movable in the anteroposterior direction (along arrows X1 and X2) by an air cylinder 551.

The control portion 6 is previously taught a transport position for transporting each substrate 10 with the corresponding substrate transport hand 5. More specifically, the control portion 6 is previously taught the transport position as to the untreated substrate 10b supported by the upper receiving portions 522 of the front support portions 52 and the receiving portions 541 of the rear support portions 54. In other words, the control portion 6 is previously taught the position of the substrate transport hand 5 for receiving the untreated substrate 10b thereon and the position for moving the same from the substrate transport hand 5 to another place. Further, the control portion 6 is formed to decide a transport position as to the treated substrate 10a supported by the lower receiving portions 521 of the front support portions 52 and the receiving portions 531 of the rear fixed support portions 53 on the basis of the transport position as to the untreated substrate 10b. In other words, the control portion 6 decides the transport position of the substrate transport hand 5 for the treated substrate 10a supported on the position different from that of the untreated substrate 10b with respect to the hand body portion 51 on the basis of the transport position as to the untreated substrate 10b.

The operating procedure of each substrate transport hand 5 of the substrate transport robot 100 according to the first embodiment for supporting each substrate 10 is now described.

In order to support the treated substrate 10a with the substrate transport hand 5, the rear movable support portions 54 are moved to the second position on the rear side (along arrow X2 in FIG. 5) of the hand body portion 51, as shown in FIGS. 5 and 8. Then, the hand body portion 51 arranged under the treated substrate 10a is moved upward, thereby bringing the treated substrate 10a into contact with the lower receiving portions 521 of the front support portions 52 and the receiving portions 531 of the rear fixed support portions 53. Thereafter the pressing portion 55 presses the treated substrate 10a toward the forward end side, thereby pressing the same against the wall portions 521b of the lower receiving portions 521. In other words, the treated substrate 10a is supported by the lower receiving portions 521 of the front support portions 52 and the receiving portions 531 of the rear fixed support portions 53 in the state pressed against the wall portions 521b.

In order to support the untreated substrate 10b with the substrate transport hand 5, the rear movable support portions 54 are moved to the first position on the front side (along arrow X1 in FIG. 6) of the hand body portion 51, as shown in FIGS. 6 and 9. Then, the hand body portion 51 arranged under the untreated substrate 10b is moved upward, thereby bringing the untreated substrate 10b into contact with the upper receiving portions 522 of the front support portions 52 and the receiving portions 541 of the rear movable support portions 54. Thereafter the pressing portion 55 presses the untreated substrate 10b toward the forward end side, thereby pressing the same against the wall portions 522b of the upper receiving portions 522. In other words, the untreated substrate 10b is supported by the upper receiving portions 522 of the front support portions 52 and the receiving portions 541 of the rear movable support portions 54 in the state pressed against the wall portions 522b.

According to the first embodiment, as hereinabove described, the receiving portions 531 of the rear fixed support portions 53 are provided for supporting the treated substrate 10a received on the lower receiving portions 521 along with the lower receiving portions 521, while the receiving portions 541 of the rear movable support portions 54 are movably provided on the hand body portion 51 for supporting the untreated substrate 10b received on the upper receiving portions 522 along with the upper receiving portions 522 when moved to the first position on the front side (along arrow X1 in FIG. 6) of the hand body portion 51. Thus, the substrate transport hand 5 can support the substrates 10 with the different receiving portions 531 and 541 in the simple structure of not moving the hand body portion 51 itself but moving the receiving portions 541 provided thereon with respect to the hand body portion 51. Consequently, the substrate transport hand 5 having the simple structure can support the substrates 10 by properly using the different receiving portions 531 and 541.

According to the first embodiment, as hereinabove described, the receiving portions 531 of the rear fixed support portions 53 are formed to support the treated substrate 10a along with the lower receiving portions 521 on the position different from that of the untreated substrate 10b when moved to the second position, different from the first position, on the rear side (along arrow X2 in FIG. 5) of the hand body portion 51. According to this structure, the receiving portions 541 of the rear movable support portions 54 can be moved to the second position so that the same do not come into contact with the treated substrate 10a, whereby the treated and untreated substrates 10a and 10b can be inhibited from coming into contact with the same receiving portions.

According to the first embodiment, as hereinabove described, the upper receiving portions 522 and the receiving portions 541 of the rear movable support portions 54 are formed to support the untreated substrate 10b when moved to the first position where the receiving portions 541 more approach the upper receiving portions 522 than on the second position, while the lower receiving portions 521 and the receiving portions 531 of the rear fixed support portions 53 are formed to support the treated substrate 10a when the rear movable support portions 54 are moved to the second position where the receiving portions 541 thereof more separate from the upper receiving portions 522 than on the first position. According to this structure, the substrate transport hand 5 can easily support the untreated substrate 10b with the upper receiving portions 522 and the receiving portions 541 of the rear movable support portions 54 by approximating the receiving portions 541 of the rear movable support portions 54 to the upper receiving portions 522. Further, the substrate transport hand 5 can support the treated substrate 10a with the lower receiving portions 521 and the receiving portions 531 of the rear fixed support portions 53 while inhibiting the receiving portions 531 of the rear fixed support portions 53 from coming into contact with the treated substrate 10a by separating the receiving portions 531 of the rear fixed support portions 53 from the upper receiving portions 522.

According to the first embodiment, as hereinabove described, the lower receiving portions 521 and the upper receiving portions 522 are arranged on the vertical positions different from each other, while the receiving portions 531 of the rear fixed support portions 53 and the receiving portions 541 of the rear movable support portions 54 are arranged on the vertical positions corresponding to those of the lower receiving portions 521 and the upper receiving portions 522 respectively. Further, the upper receiving portions 522 and the receiving portions 541 of the rear movable support portions 54 are formed to support the untreated substrate 10b on the vertical position different from that of the treated substrate 10a supported by the lower receiving portions 521 and the receiving portions 531 of the rear fixed support portions 53 when moved to the first position on the hand body portion 51. According to this structure, the substrate transport hand 5 can easily inhibit the treated and untreated substrates 10a and 10b from coming into contact with the same receiving portions due to the different vertical positions for supporting the treated and untreated substrates 10a and 10b respectively.

According to the first embodiment, as hereinabove described, the lower receiving portions 521 and the upper receiving portions 522 are arranged on the positions deviating from each other in plan view, whereby the substrate transport hand 5 can easily inhibit the treated and untreated substrates 10a and 10b from coming into contact with the same receiving portions due to different plane positions for supporting the treated and untreated substrates 10a and 10b respectively.

According to the first embodiment, as hereinabove described, the lower receiving portions 521, the upper receiving portions 522 and the receiving portions 531 of the rear fixed support portions 53 are fixedly provided on the hand body portion 51 while the upper receiving portions 522 and the receiving portions 541 of the rear movable support portions 54 are formed to support the untreated substrate 10b on the position different from that of the treated substrate 10a when the receiving portions 541 of the rear movable support portions 54 are moved to the first position on the hand body portion 51. According to this structure, the substrate transport hand 5 can easily support the substrates 10 on the different positions by properly using the different receiving portions in the simple structure of rendering only the receiving portions 541 of the rear movable support portions 54 movable with respect to the hand body portion 51 among the lower receiving portions 521, the upper receiving portions 522, the receiving portions 531 of the rear fixed support portions 53 and the receiving portions 541 of the rear movable support portions 54.

According to the first embodiment, as hereinabove described, the lower receiving portions 521 and the upper receiving portions 522 are integrally provided on the forward end side (front side) of the hand body portion 51 while the receiving portions 531 of the rear fixed support portions 53 and the receiving portions 541 of the rear movable support portions 54 are provided on the base side (rear side) of the hand body portion 51 independently of each other. According to this structure, increase in the number of components can be suppressed as compared with a case of providing the lower receiving portions 521 and the upper receiving portions 522 independently of each other. Further, the receiving portions 531 and 541 are provided on the base side (rear side) of the hand body portion 51 independently of each other, whereby the receiving portions 541 can be easily moved while keeping the receiving portions 531 in the fixed state.

According to the first embodiment, as hereinabove described, the lower receiving portions 521 and the upper receiving portions 522 are formed on the stepwise front support portions 52. According to this structure, the lower receiving portions 521 and the upper receiving portions 522 can be provided on the vertical positions different from each other in the structure of integrally forming the lower receiving portions 521 and the upper receiving portions 522, whereby the substrate transport hand 5 can easily support the substrates 10 on the different positions by properly using the different receiving portions.

According to the first embodiment, as hereinabove described, the lower receiving portions 521 and the receiving portions 531 of the rear fixed support portions 53 are formed to support the treated substrate 10*a* in the state pressed against the wall portions 521*b* by the pressing portion 55 while the upper receiving portions 522 and the receiving portions 541 of the rear movable support portions 54 are formed to support the untreated substrate 10*b* in the state pressed against the wall portions 522*b* by the pressing portions 55. According to this structure, the substrate transport hand 5 can support the substrates 10 (10*a* and 10*b*) in the stable states pressed against the wall portions 521*b* and 522*b* by the pressing portion 55, thereby stably transporting the substrates 10.

According to the first embodiment, as hereinabove described, the substrate transport hand 5 is provided with the plurality of lower receiving portions 521, the plurality of upper receiving portions 522, the plurality of receiving portions 531 of the rear fixed support portions 53 and the plurality of receiving portions 541 of the rear movable support portions 54. According to this structure, the substrate transport hand 5 can support the substrates 10 (10*a* and 10*b*) on a larger number of receiving portions, thereby more stably supporting the substrates 10.

According to the first embodiment, as hereinabove described, the substrate transport hand 5 is provided with the coupling portion 54*b* coupling the pair of rear movable support portions 54 having the receiving portions 541 with each other and the air cylinder 54*c* moving the coupling portion 54*b* and formed to move the receiving portions 541 of the pair of rear movable support portions 54 by moving the coupling portion 54*b* with the air cylinder 54*c*. According to this structure, the substrate transport hand 5 can move the pair of receiving portions 541 with the common air cylinder 54*c*, whereby no different air cylinders may be provided for the receiving portions 541 respectively.

According to the first embodiment, as hereinabove described, the substrate transport hand 5 is formed to support the treated and untreated substrates 10*a* and 10*b* on the different receiving portions respectively. Even if foreign matter adheres to the treated substrate 10*a* or the untreated substrate 10*b*, therefore, the substrate transport robot 100 employing the common substrate transport hand 5 can inhibit the foreign matter from adhering to the untreated substrate 10*b* or the treated substrate 10*a*.

According to the first embodiment, as hereinabove described, the control portion 6 is formed to decide the transport position of the substrate transport hand 5 as to the treated substrate 10*a* on the basis of the taught transport position of the substrate transport hand 5 as to the untreated substrate 10*b* when the transport position of the substrate transport hand 5 is taught as to the untreated substrate 10*b* supported by the upper receiving portions 522 and the receiving portions 541 of the rear movable support portions 54. According to this structure, the user may simply teach the control portion 6 the transport position of the substrate transport hand 5 as to the untreated substrate 10*b* without teaching the transport position as to the treated substrate 10*a* supported on the position different from that of the untreated substrate 10*b* with respect to the hand body portion 51, whereby a burden on the user can be reduced.

According to the first embodiment, as hereinabove described, the second arm portion 4 mounted with the substrate transport hands 5 on the forward ends is so provided that the substrate transport robot 100 can transport the substrates 10 over a wide range due to the length of the second arm portion 4.

According to the first embodiment, as hereinabove described, the two substrate transport hands 5 including the lower receiving portions 521, the upper receiving portions 522, the receiving portions 521 of the rear fixed support portions 53 and the receiving portions 541 of the rear movable support portions 54 are mounted on the second arm portion 4 in the state arranged to vertically overlap with each other, whereby the substrate transport robot 100 can simultaneously transport a larger number of substrates 10 as compared with a case where the same is provided with only one substrate transport hand 5.

(Second Embodiment)

Figure 10:
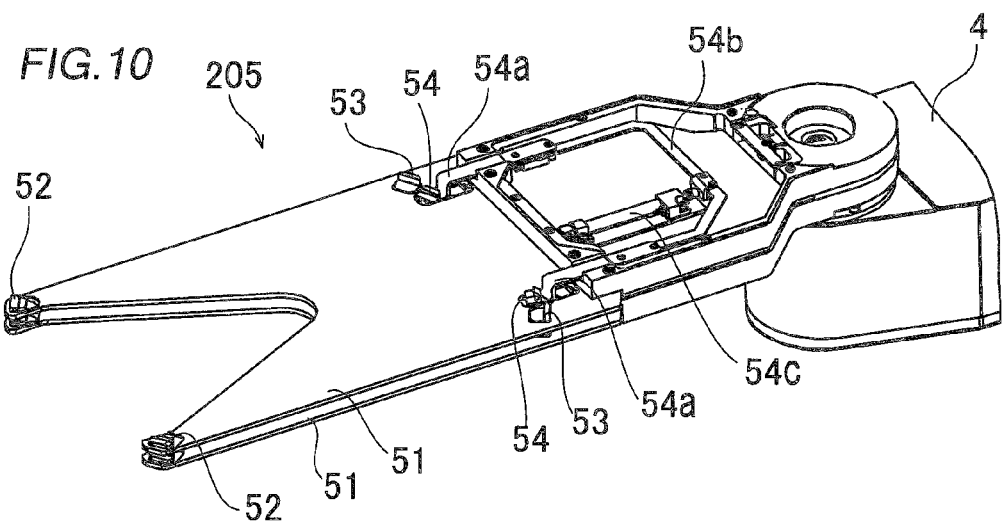
FIG. 10 is a perspective view showing a substrate transport hand according to a second embodiment of the present invention.

A substrate transport hand 205 according to a second embodiment of the present invention is now described with reference to FIG. 10. According to the second embodiment, the substrate transport hand 205 is provided with no pressing portion, dissimilarly to the aforementioned first embodiment. As to the substrate transport hand 205 according to the second embodiment, elements identical to those in the aforementioned first embodiment are denoted by the same reference numerals, and redundant description is not repeated.

The substrate transport hand 205 according to the second embodiment of the present invention is provided with no pressing portion pressing substrates 10 (10*a* and 10*b*) toward the forward end side. In other words, the substrate transport hand 205 is formed to support the substrates 10 (10*a* and 10*b*) not pressed against wall portions 521*b* and 522*b* but simply received on support portions 52 to 54.

The remaining structure of the second embodiment is similar to that of the aforementioned first embodiment.

According to the second embodiment, the substrate transport hand 205 can support the substrates 10 by properly using different receiving portions in a simple structure similarly to the aforementioned first embodiment, and provided with no pressing portion pressing the substrates 10 in order to inhibit the substrates 10 from moving on receiving surfaces 521*a* (522*a*), thereby protecting the substrates 10 against scratches.

The remaining effects of the second embodiment are similar to those of the aforementioned first embodiment.

(Third Embodiment)

Figure 11:
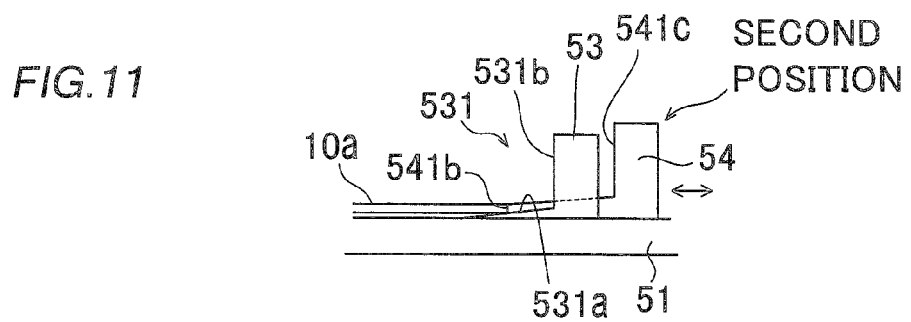
FIG. 11 is a side elevational view showing a state where a receiving portion of a rear movable support portion of a substrate transport hand according to a third embodiment of the present invention is located on a second position.
Figure 12:
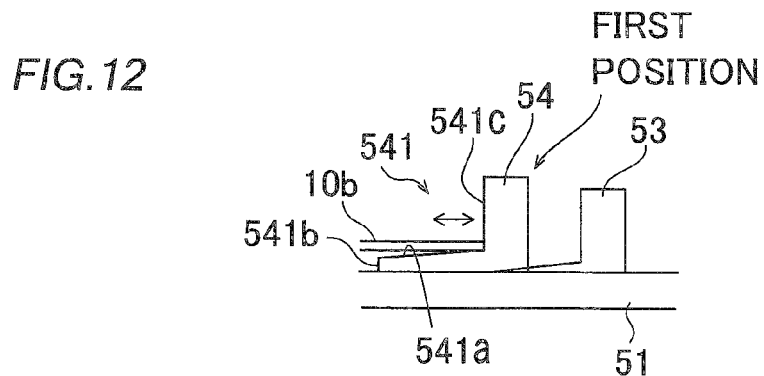
FIG. 12 is a side elevational view showing a state where the receiving portion of the rear movable support portion of the substrate transport hand according to the third embodiment of the present invention is located on a first position.

A substrate transport hand 5 according to a third embodiment of the present invention is now described with reference to FIGS. 11 and 12. According to the third embodiment, the substrate transport hand 5 has a structure of pressing substrates 10 against wall portions 521*b* (522*b*) with rear movable support portions 54, dissimilarly to the substrate transport hand 5 according to the aforementioned first embodiment pressing the substrates 10 against the wall portions 521b (522b) with the pressing portion 55. As to the substrate transport hand 5 according to the third embodiment, elements identical to those in the aforementioned first embodiment are denoted by the same reference numerals, and redundant description is not repeated.

According to the third embodiment, the substrate transport hand 5 is formed to press substrates 10 toward the forward end side (along X1 in FIGS. 5 and 6) with the rear movable support portions 54. More specifically, each rear movable support portion 54 is formed to press a treated substrate 10a toward the forward end side with a front wall portion 541b on a second position when the substrate transport hand 5 supports the treated substrate 10a with a lower receiving portion 521 of each front support portion 52 and a receiving portion 531 of each rear fixed support portion 53. Thus, the treated substrate 10a is pressed against a wall portion 521b of each lower receiving portion 521.

Further, the rear movable support portion 54 is formed to press an untreated substrate 10b toward the forward end side with a rear wall portion 541c while receiving the untreated substrate 10b on a receiving surface 541a on a first position when the substrate transport hand 5 supports the untreated substrate 10b with an upper receiving portion 522 of each front support portion 52 and a receiving portion 541 of the rear movable support portion 54. Thus, the untreated substrate 10b is pressed against a wall portion 522b of the upper receiving portion 522.

The remaining structure of the third embodiment is similar to that of the aforementioned first embodiment.

According to the third embodiment, the substrate transport hand 5 can support the substrates 10 by properly using the different receiving portions in a simple structure similarly to the aforementioned first embodiment, and formed to press the substrates 10 against the wall portions 521b (522b) with the rear movable support portions 54 as hereinabove described so that the same can support the substrates 10 in stable states pressed against the wall portions 521b (522b) without employing a dedicated pressing portion pressing the substrates 10, whereby the substrate transport hand 5 can stably transport the substrates 10 while suppressing increase in the number of components.

The remaining effects of the third embodiment are similar to those of the aforementioned first embodiment.

(Fourth Embodiment)

A substrate transport hand 5 according to a fourth embodiment of the present invention is now described with reference to FIGS. 13 to 15. According to the fourth embodiment, the substrate transport hand 5 has a structure of supporting substrates 10 in sucked states, dissimilarly to the substrate transport hand 5 according to the aforementioned first embodiment supporting the substrates 10 in the pressed states. As to the substrate transport hand 5 according to the fourth embodiment, elements identical to those in the aforementioned first embodiment are denoted by the same reference numerals, and redundant description is not repeated.

According to the fourth embodiment, the substrate transport hand 5 is formed to suck the substrates 10 when supporting the substrates 10. More specifically, the substrate transport hand 5 according to the fourth embodiment is mainly constituted of a hand body portion 451, a pair of front support portions 452, a pair of rear fixed support portions 453 and a pair of rear movable support portions 454. The hand body portion 451, the front support portions 452, the rear fixed support portions 453 and the rear movable support portions 454 correspond to the hand body portion 5, the front support portions 52, the rear fixed support portions 53 and the rear movable support portions 54 of the substrate transport hand 5 according to the aforementioned first embodiment respectively.

Figure 13:
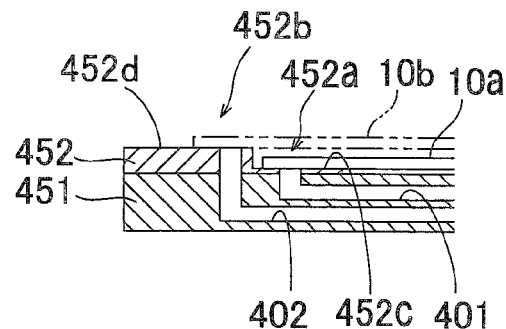
FIG. 13 is a sectional view showing lower and upper receiving portions of a substrate transport hand according to a fourth embodiment of the present invention.

Each front support portion 452 is formed stepwise, and includes a lower receiving portion 452a and an upper receiving portion 452b, as shown in FIG. 13. The lower receiving portion 452a and the upper receiving portion 452b are formed to be capable of receiving the substrates 10 (10a and 10b) on different vertical positions deviating from each other in plan view. The lower and upper receiving portions 452a and 452b have receiving surfaces 452c and 452d respectively. The receiving surfaces 452c and 452d are arranged in horizontal planes respectively. The lower receiving portion 452a and the upper receiving portion 452b are examples of the "first receiving portion" and the "second receiving portion" in the present invention respectively.

The front support portion 452 is provided with suction holes 401 and 402 linked to the hand body portion 451. First ends of the suction holes 401 and 402 are exposed on the receiving surfaces 452c and 452d respectively. The suction holes 401 and 402 are so provided as to overlap with treated and untreated substrates 10a and 10b received on the receiving surfaces 452c and 452d respectively in plan view. The suction hole 401 (402), whose second end is connected to a sucking portion (not shown), is provided for sucking the treated substrate 10a (untreated substrate 10b) toward the receiving surface 452c (452d) with negative pressure.

Figure 14:
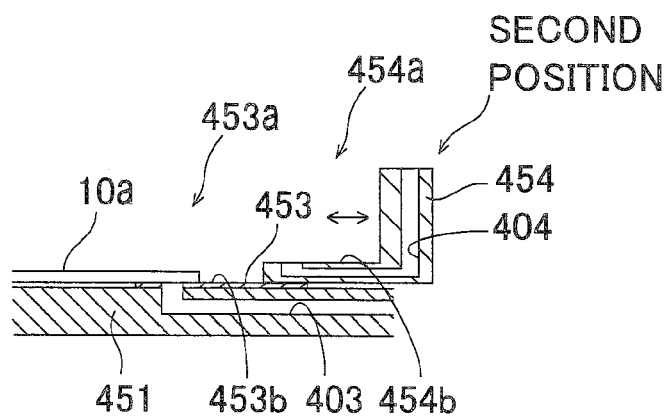
FIG. 14 is a sectional view showing a state where a receiving portion of a rear movable support portion of the substrate transport hand according to the fourth embodiment of the present invention is located on a second position.
Figure 15:
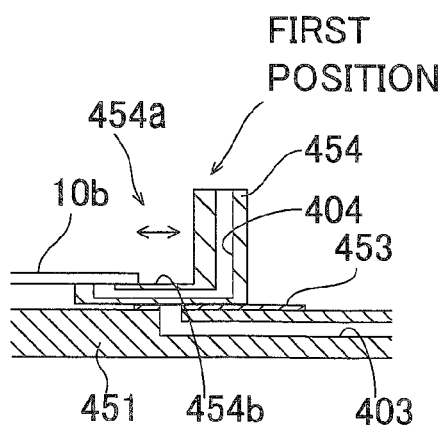
FIG. 15 is a sectional view showing a state where the receiving portion of the rear movable support portion of the substrate transport hand according to the fourth embodiment of the present invention is located on a first position.

Each rear fixed support portion 453 is provided in the form of a flat plate, as shown in FIG. 14. The rear fixed support portion 453 includes a receiving portion 453a having a receiving surface 453b. The receiving surface 453b is arranged in a horizontal plane. The rear fixed support portion 453 is provided with a suction hole 403 linked to the hand body portion 451. A first end of the suction hole 403 is exposed on the receiving surface 453b. The suction hole 403 is so provided as to overlap with the treated substrate 10a received on the receiving surface 453b in plan view. The suction hole 403, whose second end is connected to a sucking portion (not shown), is provided for sucking the treated substrate 10a toward the receiving surface 453b with negative pressure. The receiving portion 453a is an example of the "third receiving portion" in the present invention.

Each rear movable support portion 454 includes a receiving portion 454a having a receiving surface 454b. The receiving surface 454b is arranged in a horizontal plane. The rear movable support portion 454 is provided with a suction hole 404. A first end of the suction hole 404 is exposed on the receiving surface 454b. A sucking portion (not shown) is connected to a second end of the suction hole 404. The suction hole 404 is so provided as to overlap with the untreated substrate 10b received on the receiving surface 454b in plan view. The suction hole 404 is provided for sucking the untreated substrate 10b toward the receiving surface 454b with negative pressure from the sucking portion. The receiving portion 454a is an example of the "fourth receiving portion" in the present invention.

The remaining structure of the fourth embodiment is similar to that of the aforementioned first embodiment.

According to the fourth embodiment, the substrate transport hand 5 can support the substrates 10 by properly using the different receiving portions in a simple structure similarly to the aforementioned first embodiment, while the lower receiving portions 452a and the receiving portions 453a of the rear fixed support portions 453 are formed to support the treated substrate 10a in the state sucked to be regulated in movement and the upper receiving portions 452b and the receiving surfaces 454b of the rear movable support portions 454 are formed to support the untreated substrate 10b in the state sucked to be regulated in movement, whereby the substrate transport hand 5 can support the substrates 10 (10a and 10b) in the stable states sucked toward the receiving surfaces with negative pressure, for stably transporting the substrates 10. Further, the substrates 10 are inhibited from moving on the receiving surfaces dissimilarly to a case where the substrate transport hand 5 stabilizes the substrates 10 by pressing the same with a pressing portion, whereby the substrates 10 can be protected against scratches.

The remaining effects of the fourth embodiment are similar to those of the aforementioned first embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the substrate transport hand according to the present invention is applied to the articulated robot in each of the aforementioned first to fourth embodiments, the present invention is not restricted to this. The substrate transport hand according to the present invention may alternatively be applied to a robot other than the articulated robot.

While only the receiving portion of each rear movable support portion as the example of the fourth receiving portion is movably provided on the hand body portion in each of the aforementioned first to fourth embodiments, the present invention is not restricted to this. According to the present invention, any or plurality of ones of the first to third receiving portions may also be movably provided on the hand body portion, in addition to the fourth receiving portion.

While the substrate transport hand supports the treated and untreated substrates as the examples of the first and second substrates respectively on the vertical positions different from each other in each of the aforementioned first to fourth embodiments, the present invention is not restricted to this. According to the present invention, the substrate transport hand may alternatively support the first and second substrates on the same position, or on the same vertical positions different from each other in plan view.

While the treated and untreated substrates are shown as the examples of the first and second substrates respectively in each of the aforementioned first to fourth embodiments, the present invention is not restricted to this. According to the present invention, the untreated and treated substrates may alternatively be employed as the examples of the first and second substrates respectively. In other words, the untreated and treated substrates may be received on the lower and upper receiving portions respectively.

While the control portion decides the transport position of the substrate transport hand with respect to the treated substrate (first substrate) supported on the position different from that of the untreated substrate on the basis of the transport position as to the untreated substrate (second substrate) in each of the aforementioned first to fourth embodiments, the present invention is not restricted to this. According to the present invention, the control portion may alternatively decide the transport position of the substrate transport hand with respect to the untreated substrate (second substrate) supported on the position different from that of the treated substrate on the basis of the transport position as to the treated substrate (first substrate).

While the substrate transport robot is provided with the two substrate transport hands in each of the aforementioned first to fourth embodiments, the present invention is not restricted to this. According to the present invention, the substrate transport robot may alternatively be provided with one substrate transport hand or at least three substrate transport hands.

While the suction holes for sucking the substrates are provided on the lower receiving portions (first receiving portions), the upper receiving portions (second receiving portions), the receiving portions (third receiving portions) of the rear fixed support portions and the receiving portions (fourth receiving portions) of the rear movable support portions respectively in the aforementioned fourth embodiment, the present invention is not restricted to this. According to the present invention, the suction holes may simply be provided on at least any of the first, second, third and fourth receiving portions.

What is claimed is:

1. A substrate transport hand comprising:
   a hand body portion;
   a first receiving portion and a second receiving portion capable of receiving a first substrate and a second substrate thereon respectively;
   a third receiving portion supporting said first substrate received on said first receiving portion along with said first receiving portion; and
   a fourth receiving portion movably provided on said hand body portion for supporting said second substrate received on said second receiving portion along with said second receiving portion when moved to a first position of said hand body portion.

2. The substrate transport hand according to claim 1, wherein
   said third receiving portion is formed to support said first substrate along with said first receiving portion on a position different from that of said second substrate when said fourth receiving portion is moved to a second position different from said first position of said hand body portion.

3. The substrate transport hand according to claim 2, wherein
   said second receiving portion and said fourth receiving portion support said second substrate when said fourth receiving portion is moved to said first position where said fourth receiving portion more approaches said second receiving portion than on said second position, and
   said first receiving portion and said third receiving portion are formed to support said first substrate when said fourth receiving portion is moved to said second position where said fourth receiving portion more separates from said second receiving portion than on said first position.

4. The substrate transport hand according to claim 1, wherein
   said first receiving portion and said second receiving portion are arranged on vertical positions different from each other,
   said third receiving portion and said fourth receiving portion are arranged on vertical positions corresponding to those of said first receiving portion and said second receiving portion respectively, and
   said second receiving portion and said fourth receiving portion are formed to support said second substrate on a vertical position different from that of said first substrate supported by said first receiving portion and said third receiving portion when said fourth receiving portion is moved to said first position of said hand body portion.

5. The substrate transport hand according to claim 1, wherein
   said first receiving portion and said second receiving portion are arranged on positions deviating from each other in plan view.

6. The substrate transport hand according to claim 1, wherein
said first receiving portion, said second receiving portion and said third receiving portion are fixedly provided on said hand body portion,
said first receiving portion and said third receiving portion support said first substrate, and
said second receiving portion and said fourth receiving portion are formed to support said second substrate on a position different from that of said first substrate when said fourth receiving portion is moved to said first position of said hand body portion.

7. The substrate transport hand according to claim 1, wherein
said first receiving portion and said second receiving portion are integrally provided on the forward end side of said hand body portion, and
said third receiving portion and said fourth receiving portion are provided on the base side of said hand body portion independently of each other.

8. The substrate transport hand according to claim 7, wherein
said first receiving portion and said second receiving portion are formed on a stepwise front support portion,
said first receiving portion is arranged on a first step of said stepwise front support portion, and
said second receiving portion is arranged on a second step of said stepwise front support portion.

9. The substrate transport hand according to claim 1, further comprising a pressing portion capable of pressing said first substrate and said second substrate, wherein
said first receiving portion and said second receiving portion have a first wall portion and a second wall portion respectively,
said first receiving portion and said third receiving portion support said first substrate in a state pressed against said first wall portion by said pressing portion, and
said second receiving portion and said fourth receiving portion are formed to support said second substrate in a state pressed against said second wall portion by said pressing portion.

10. The substrate transport hand according to claim 1, wherein
said fourth receiving portion is formed to be capable of pressing said first substrate and said second substrate,
said first receiving portion and said second receiving portion have a first wall portion and a second wall portion respectively,
said first receiving portion and said third receiving portion support said first substrate in a state pressed against said first wall portion by said fourth receiving portion, and
said second receiving portion and said fourth receiving portion are formed to support said second substrate in a state pressed against said second wall portion by said fourth receiving portion.

11. The substrate transport hand according to claim 1, wherein
suction holes for sucking a substrate are provided on at least any of said first receiving portion, said second receiving portion, said third receiving portion and said fourth receiving portion.

12. The substrate transport hand according to claim 11, wherein
said first receiving portion and said third receiving portion are provided with suction holes for sucking said first substrate respectively,
said second receiving portion and said fourth receiving portion are provided with suction holes for sucking said second substrate respectively,
said first receiving portion and said third receiving portion support said first substrate in a state sucked through said suction holes to be regulated in movement, and
said second receiving portion and said fourth receiving portion are formed to support said second substrate in a state sucked through said suction holes to be regulated in movement.

13. The substrate transport hand according to claim 1, provided with a plurality of said first receiving portions, a plurality of said second receiving portions, a plurality of said third receiving portions and a plurality of said fourth receiving portions respectively.

14. The substrate transport hand according to claim 13, further comprising:
a coupling portion coupling said plurality of fourth receiving portions with each other, and
a driving portion moving said coupling portion, wherein
said driving portion is formed to move said plurality of fourth receiving portions to said first position by moving said coupling portion.

15. The substrate transport hand according to claim 1, wherein
either said first substrate or said second substrate is a treated substrate treated by a treating apparatus, and
either said second substrate or said first substrate is an untreated substrate not yet treated by said treating apparatus.

16. A substrate transport robot comprising:
a substrate transport hand; and
a control portion controlling said substrate transport hand, wherein
said substrate transport hand includes:
a hand body portion;
a first receiving portion and a second receiving portion capable of receiving a first substrate and a second substrate thereon respectively;
a third receiving portion supporting said first substrate received on said first receiving portion along with said first receiving portion; and
a fourth receiving portion movably provided on said hand body portion for supporting said second substrate received on said second receiving portion along with said second receiving portion when moved to a first position of said hand body portion.

17. The substrate transport robot according to claim 16, wherein
said first substrate and said second substrate are supported on positions different from each other with respect to said hand body portion, and
said control portion is so formed, when taught a transport position as to either said first substrate supported by said first receiving portion and said third receiving portion or said second substrate supported by said second receiving portion and said fourth receiving portion, as to decide a transport position as to either said second substrate or said first substrate on the basis of said transport position taught as to either said first substrate or said second substrate.

18. The substrate transport robot according to claim 16, further comprising an arm portion mounted with said substrate transport hand on the forward end thereof.

19. The substrate transport robot according to claim 18, provided with a plurality of said substrate transport hands each including said first receiving portion, said second receiving portion, said third receiving portion and movable said fourth receiving portion, wherein
said plurality of substrate transport hands are mounted on said arm portion in a state arranged to vertically overlap with each other.

20. The substrate transport robot according to claim 16, wherein
said third receiving portion is formed to support said first substrate along with said first receiving portion on a position different from that of said second substrate when said fourth receiving portion is moved to a second position different from said first position of said hand body portion.

* * * * *